US010609817B2

(12) United States Patent
Meshii et al.

(10) Patent No.: US 10,609,817 B2
(45) Date of Patent: Mar. 31, 2020

(54) WIRING-BURIED GLASS SUBSTRATE, AND INERTIAL SENSOR ELEMENT AND INERTIAL SENSOR USING SAME

(71) Applicant: Panasonic Intellectual Property Management Co. Ltd., Osaka (JP)

(72) Inventors: Ryosuke Meshii, Osaka (JP); Kazuo Goda, Osaka (JP); Takahiro Shinohara, Hyogo (JP); Takanori Aoyagi, Osaka (JP); Kensaku Yamamoto, Osaka (JP); Hitoshi Yoshida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 190 days.

(21) Appl. No.: 15/577,011

(22) PCT Filed: Jun. 22, 2016

(86) PCT No.: PCT/JP2016/003006
§ 371 (c)(1),
(2) Date: Nov. 27, 2017

(87) PCT Pub. No.: WO2017/010050
PCT Pub. Date: Jan. 19, 2017

(65) Prior Publication Data
US 2018/0168034 A1    Jun. 14, 2018

(30) Foreign Application Priority Data
Jul. 15, 2015    (JP) .................................. 2015-140992

(51) Int. Cl.
*H05K 1/02*    (2006.01)
*G01P 15/125*    (2006.01)
(Continued)

(52) U.S. Cl.
CPC ........... *H05K 1/0298* (2013.01); *B81B 7/007* (2013.01); *B81B 7/0074* (2013.01); *G01P 15/08* (2013.01);
(Continued)

(58) Field of Classification Search
None
See application file for complete search history.

(56) References Cited

U.S. PATENT DOCUMENTS

2006/0071578 A1* 4/2006 Drabe ................ G01C 19/5642
310/309
2013/0050227 A1* 2/2013 Petersen ............... H01L 23/053
345/501
(Continued)

FOREIGN PATENT DOCUMENTS

| JP | 2011-204950 | 10/2011 |
|---|---|---|
| JP | 2014-131830 | 7/2014 |
| WO | 2007/060290 | 5/2007 |

OTHER PUBLICATIONS

International Search Report of PCT application No. PCT/JP2016/003006 dated Sep. 20, 2016.

*Primary Examiner* — Paul M. West
*Assistant Examiner* — Mark A Shabman
(74) *Attorney, Agent, or Firm* — McDermott Will & Emery LLP

(57) ABSTRACT

A wiring-buried glass substrate includes a glass substrate and a first wiring. The glass substrate includes a first surface, a second surface perpendicular to the first surface, and a third surface facing the first surface. The first wiring includes a first pillar portion and a first beam portion. The first pillar portion extends in a first direction perpendicular to the first surface of the glass substrate. The first beam portion is connected to a first surface of the first pillar portion and extends to a second direction perpendicular to a
(Continued)

second surface of the glass substrate. The first wiring is buried in the glass substrate. The first surface of the first beam portion is exposed from a third surface of the glass substrate.

14 Claims, 16 Drawing Sheets

(51) Int. Cl.
  *G01P 15/08* (2006.01)
  *B81B 7/00* (2006.01)
  *H05K 1/03* (2006.01)
  *G01P 1/00* (2006.01)
(52) U.S. Cl.
  CPC .......... *G01P 15/125* (2013.01); *H05K 1/0306* (2013.01); *B81B 2207/092* (2013.01); *B81B 2207/096* (2013.01); *G01P 1/00* (2013.01)

(56) References Cited

U.S. PATENT DOCUMENTS

2013/0256814 A1* 10/2013 Tanaka ................. B81B 3/0021
                                                         257/415
2014/0090685 A1* 4/2014 Magalhaes Mendes ....................
                                                         H01L 51/445
                                                         136/244

* cited by examiner

FIG. 8
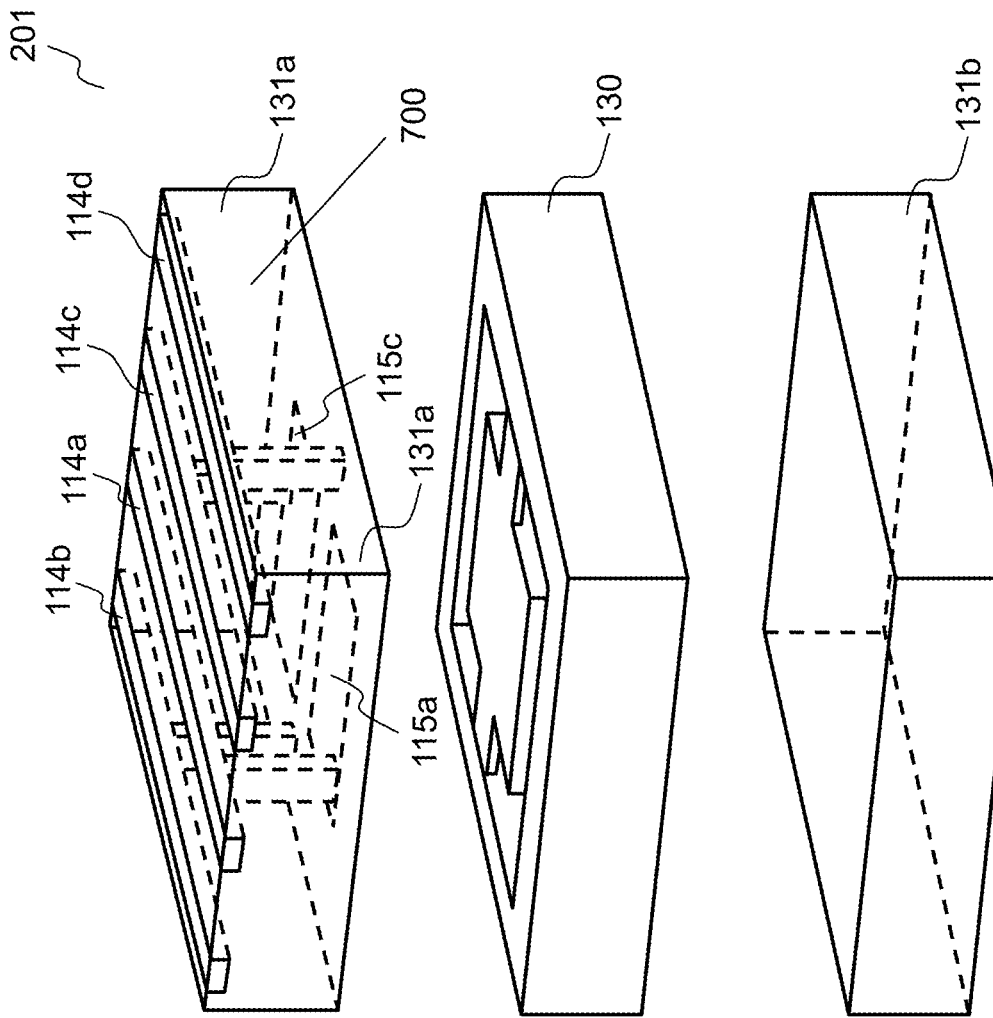
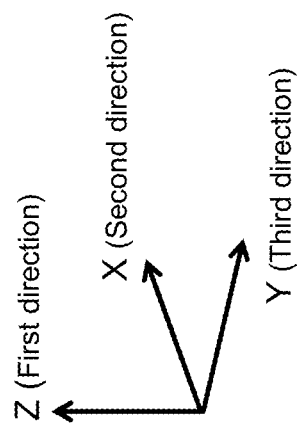

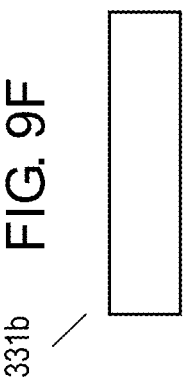
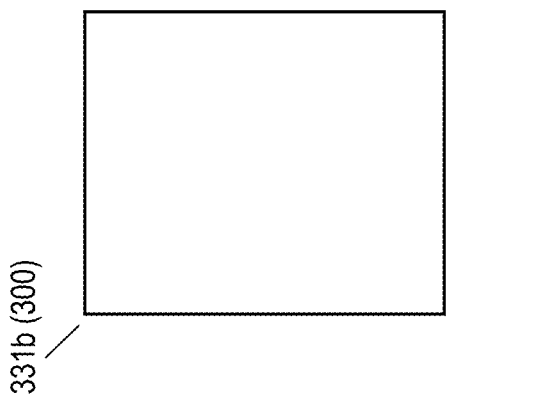
FIG. 9E
FIG. 9C
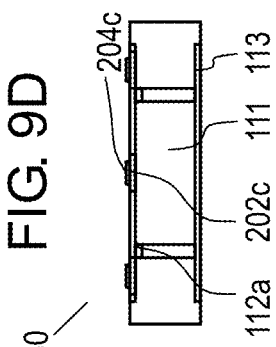
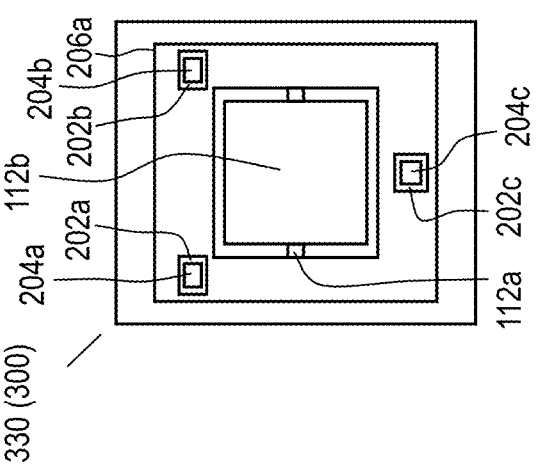
FIG. 9F
FIG. 9D
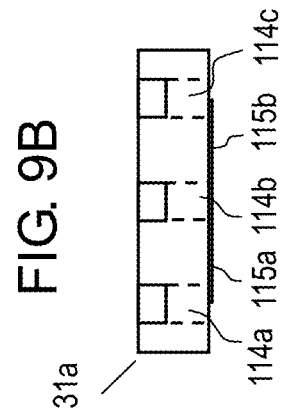
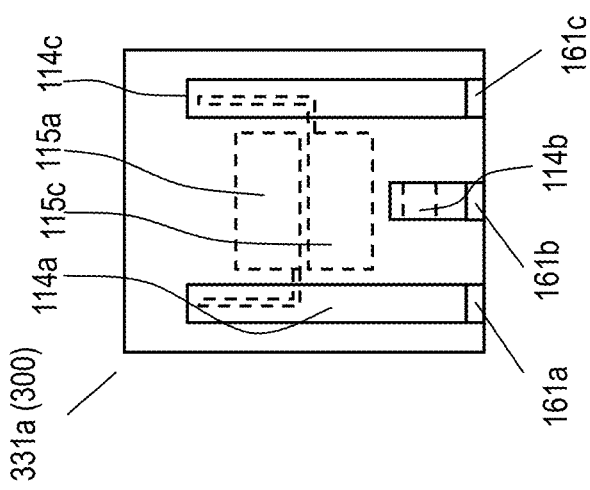
FIG. 9A
FIG. 9B

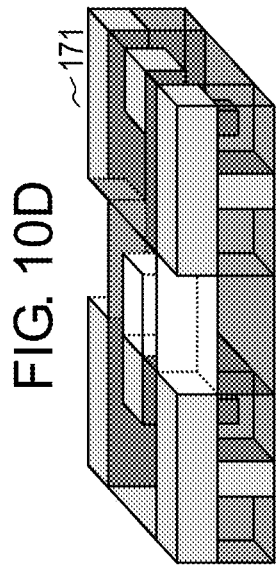
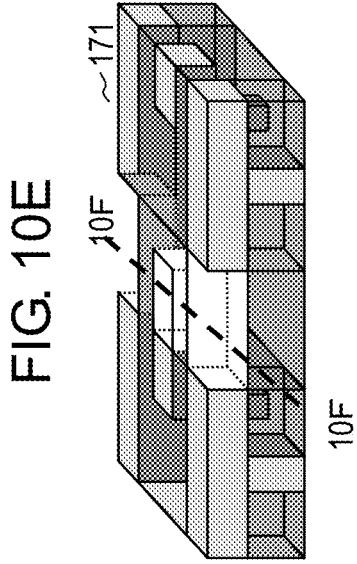
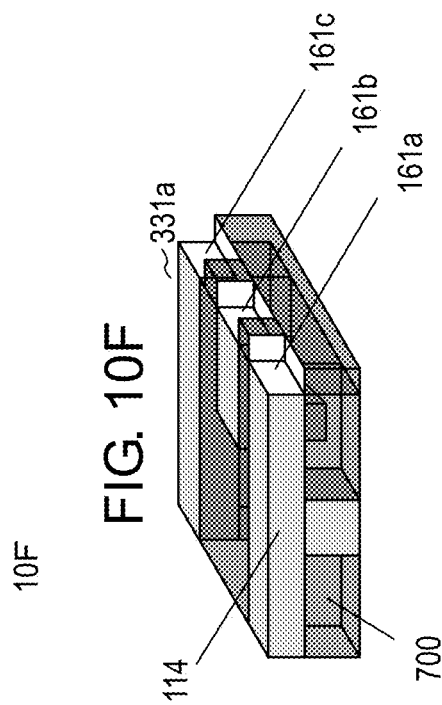
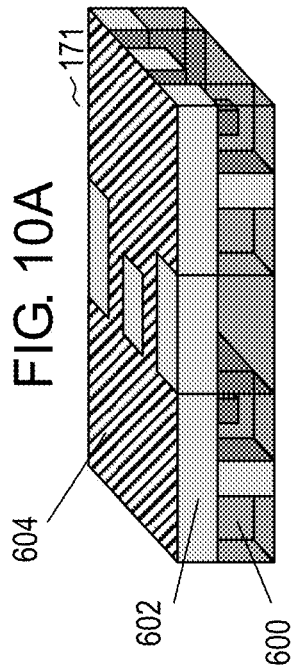
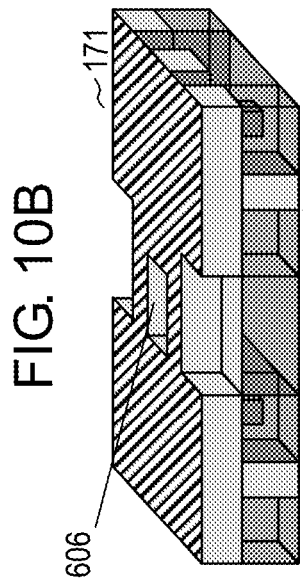
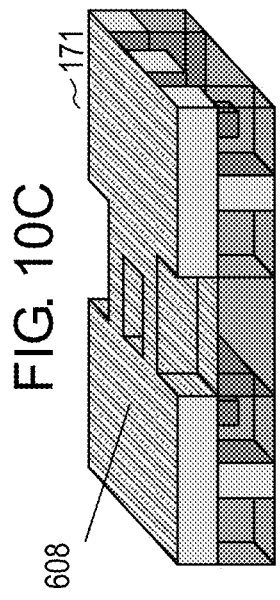

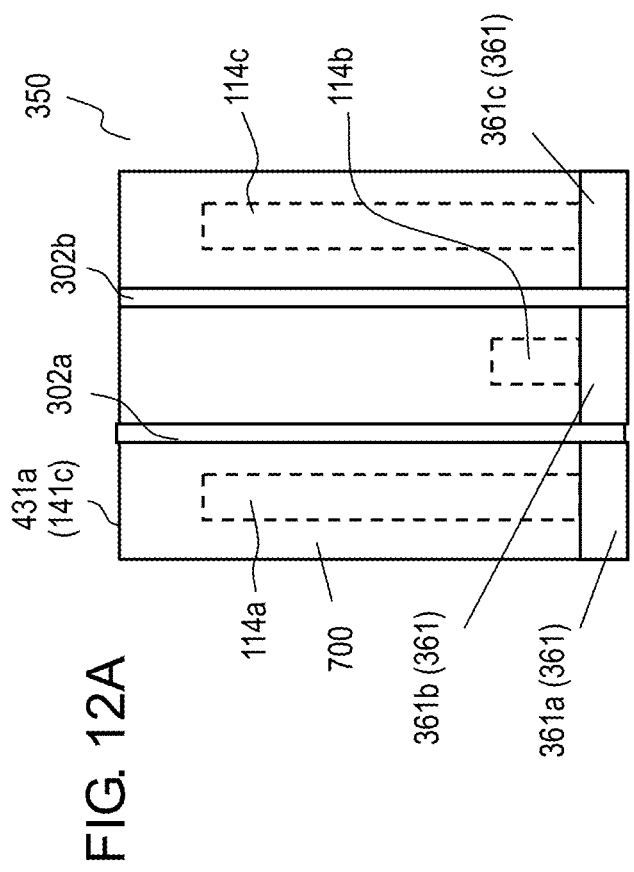
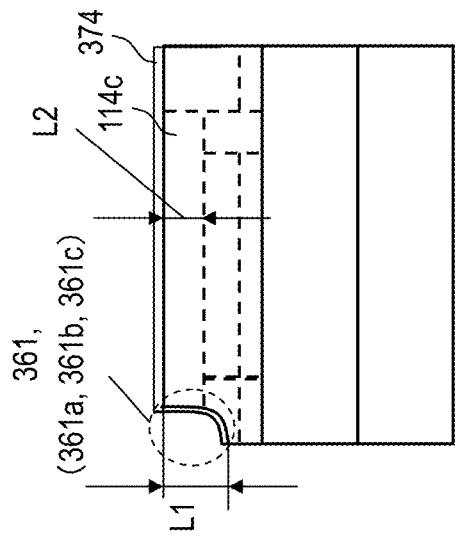
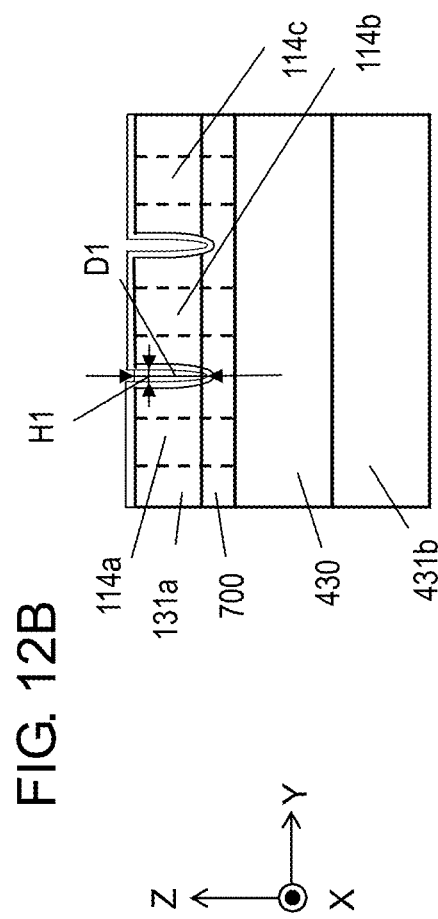
FIG. 12A
FIG. 12B
FIG. 12C

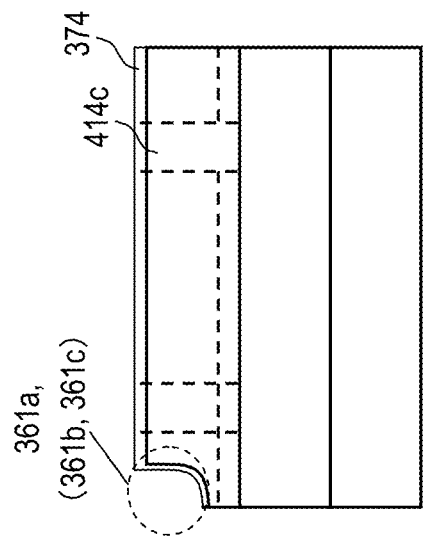
FIG. 13C
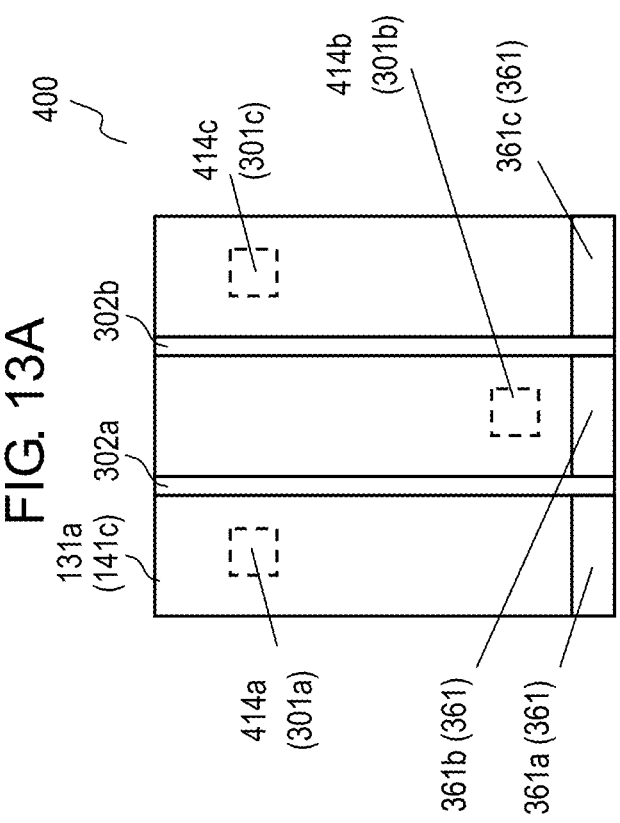
FIG. 13A
FIG. 13B

WIRING-BURIED GLASS SUBSTRATE, AND INERTIAL SENSOR ELEMENT AND INERTIAL SENSOR USING SAME

This application is a U.S. national stage application of the PCT International Application No. PCT/JP2016/003006 filed on Jun. 22, 2016, which claims the benefit of foreign priority of Japanese patent application 2015-140992 filed on Jul. 15, 2015, the contents all of which are incorporated herein by reference.

TECHNICAL FIELD

The present disclosure relates to a wiring-buried glass substrate, and an inertial sensor element and an inertial sensor using the wiring-buried glass substrate.

BACKGROUND ART

Conventionally, a wiring-buried glass substrate in which the routing of wiring is carried out using a glass substrate with wiring buried therein, and a sensor using the wiring-buried glass substrate have been known.

Note here that prior art literatures relating to this invention include, for example, PTL 1.

CITATION LIST

Patent Literature

PTL 1: Japanese Patent Application Unexamined Publication No. 2014-131830

SUMMARY OF THE INVENTION

A wiring-buried glass substrate of the present disclosure includes a glass substrate and first wiring.

The glass substrate has a first surface, a second surface perpendicular to the first surface, and a third surface opposite to the first surface.

The first wiring includes a first pillar portion and a first beam portion.

The first pillar portion extends in a first direction perpendicular to the first surface of the glass substrate.

The first beam portion is connected to a first surface of the first pillar portion, and extends to a second direction perpendicular to the second surface of the glass substrate.

The first wiring is buried in the glass substrate.

A first surface of the first beam portion is exposed from the third surface of the glass substrate.

Furthermore, an inertial sensor element of the present disclosure includes the above-mentioned wiring-buried glass substrate and a substrate for a sensor.

The substrate for a sensor includes a weight portion, a support portion, and a girder portion that supports the weight portion to the support portion.

The substrate for a sensor is connected to the wiring-buried glass substrate.

Furthermore, an inertial sensor of the present disclosure includes the above-mentioned inertial sensor element, a detection circuit, and a package substrate.

The detection circuit detects a physical quantity based on an output from the inertial sensor element.

The inertial sensor element and the detection circuit are installed on the package substrate.

BRIEF DESCRIPTION OF THE DRAWINGS

FIG. 8 is an exploded perspective view of another sensor element in accordance with the exemplary embodiment.

FIG. 9A is a top view of a second substrate of still another sensor element in accordance with the exemplary embodiment.

FIG. 9B is a front view of the second substrate of the still another sensor element in accordance with the exemplary embodiment.

FIG. 9C is a top view of a first substrate of the still another sensor element in accordance with the exemplary embodiment.

FIG. 9D is a front view of the first substrate of the still another sensor element in accordance with the exemplary embodiment.

FIG. 9E is a top view of a third substrate of the still another sensor element in accordance with the exemplary embodiment.

FIG. 9F is a front view of the third substrate of the still another sensor element in accordance with the exemplary embodiment.

FIG. 10A is a view showing a step of manufacturing a second substrate of a sensor element in accordance with the exemplary embodiment.

FIG. 10B is a view showing a step of manufacturing the second substrate of the sensor element in accordance with the exemplary embodiment.

FIG. 10C is a view showing a step of manufacturing the second substrate of the sensor element in accordance with the exemplary embodiment.

FIG. 10D is a view showing a step of manufacturing the second substrate of the sensor element in accordance with the exemplary embodiment.

FIG. 10E is a view showing a step of manufacturing the second substrate of the sensor element in accordance with the exemplary embodiment.

FIG. 10F is a view showing a step of manufacturing the second substrate of the sensor element in accordance with the exemplary embodiment.

FIG. 12A is a top view of a yet another sensor element in accordance with the exemplary embodiment.

FIG. 12B is a front view of the yet another sensor element in accordance with the exemplary embodiment.

FIG. 12C is a side view of the yet another sensor element in accordance with the exemplary embodiment.

FIG. 13A is a top view of a further sensor element in accordance with the exemplary embodiment.

FIG. 13B is a front view of the further sensor element in accordance with the exemplary embodiment.

FIG. 13C is a side view of the further sensor element in accordance with the exemplary embodiment.

DESCRIPTION OF EMBODIMENTS

In a conventional configuration, since electrical extraction can be carried out only from the top surface of a wiring-buried glass substrate, a direction in which the wiring-buried glass substrate is disposed is limited. Accordingly, a direction in which a sensor element using the wiring-buried glass substrate is disposed is limited.

Hereinafter, the exemplary embodiment of the present disclosure is described with reference to the drawings. This exemplary embodiment describes a sensor for detecting acceleration as one example of a sensor.

Figure 1:
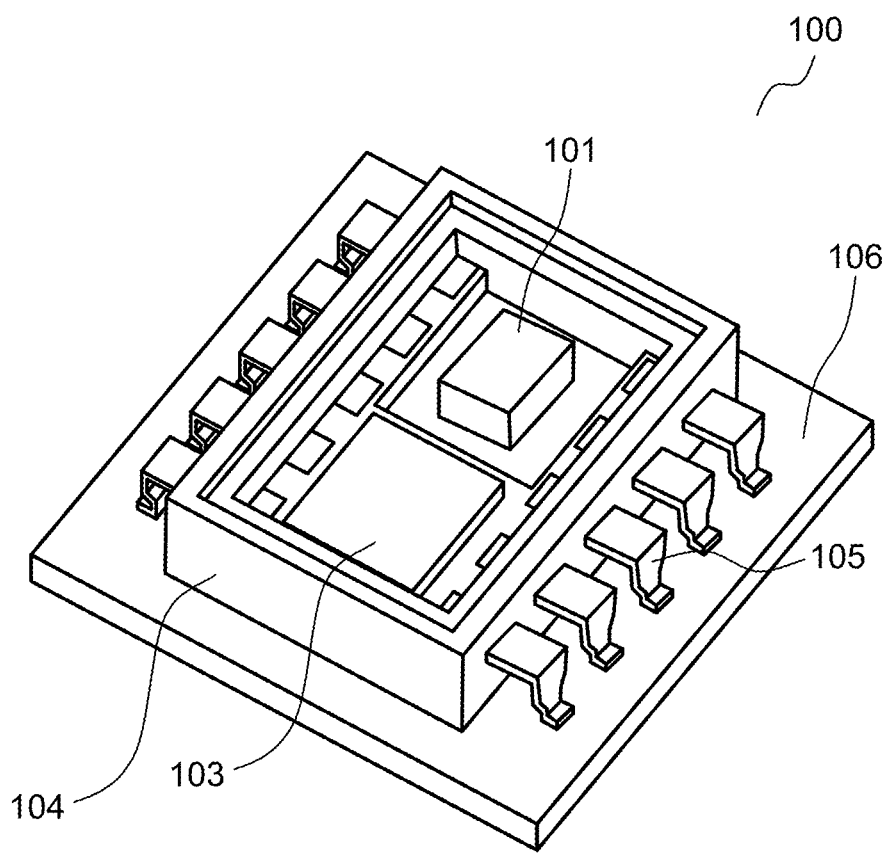
FIG. 1 is a perspective view showing the inside of a sensor in accordance with an exemplary embodiment.

FIG. 1 is a perspective view showing the inside of sensor 100 in accordance with an exemplary embodiment. As shown in FIG. 1, package substrate 104 is mounted on outer substrate 106. In order to simplify illustration, FIG. 1 does not show a lid for covering an open part of the package.

On package substrate 104, sensor element 101 and detection circuit 103 are installed. Detection circuit 103 performs various calculation and detects a physical quantity based on an output from sensor element 101.

Lead terminal 105 is led out from package substrate 104. Lead terminal 105 led out from package substrate 104 is connected to outer substrate 106.

Sensor 100 is an electrostatic capacitance-type sensor for detecting acceleration. Sensor element 101 is manufactured by, for example, MEMS (Micro Electro Mechanical Systems) technology.

Figure 2:
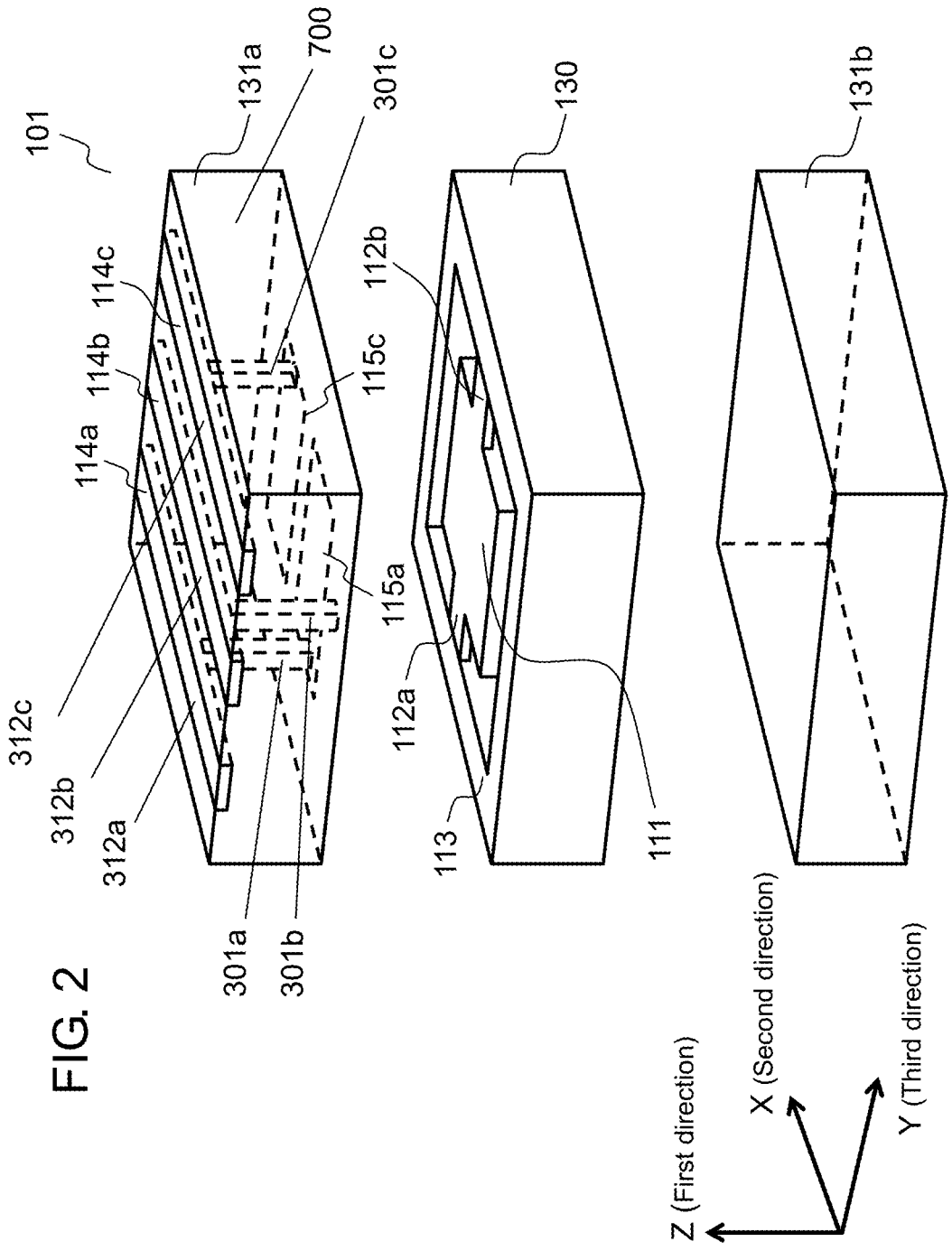
FIG. 2 is an exploded perspective view of a sensor element in accordance with the exemplary embodiment.
Figure 3:
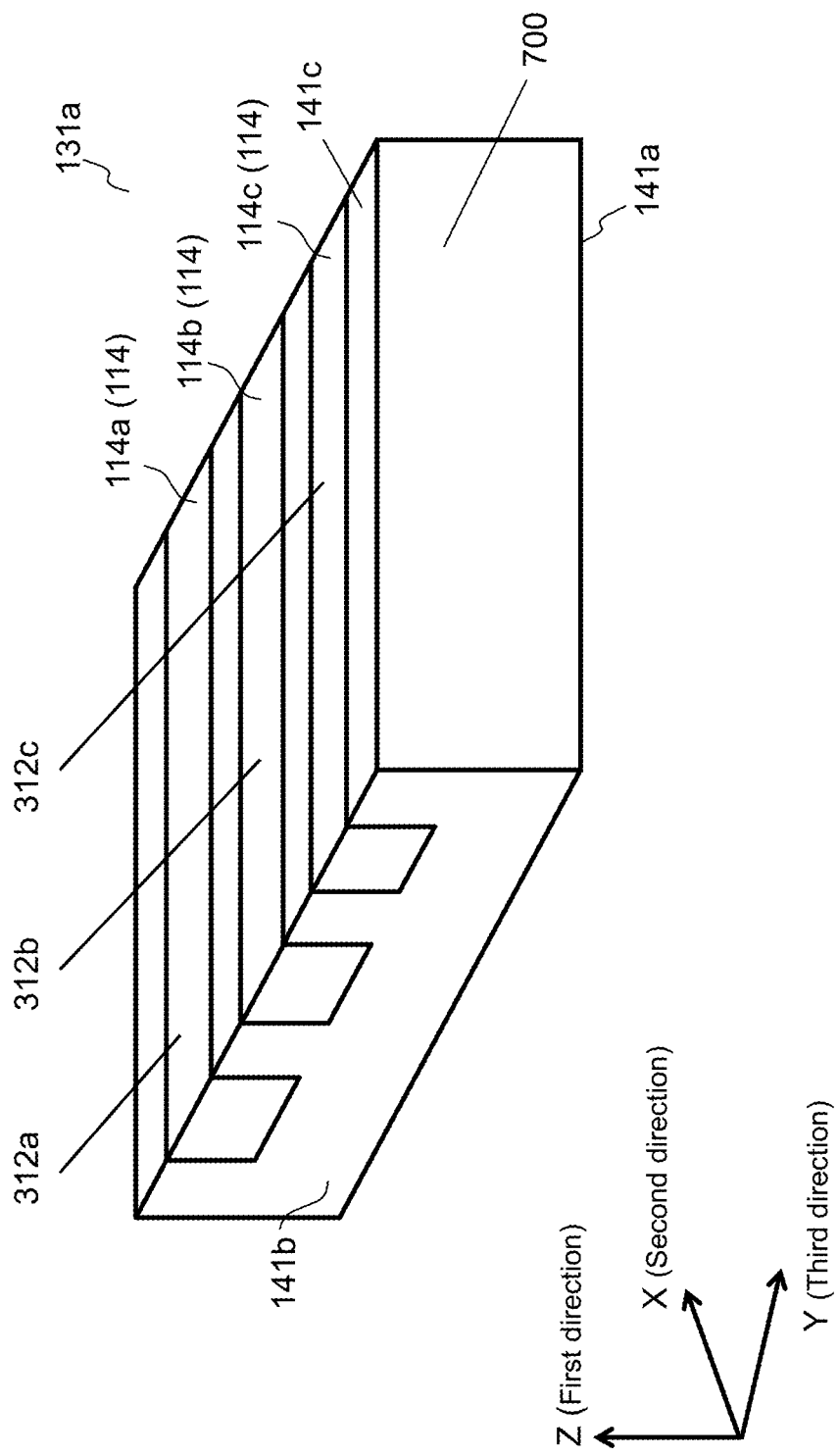
FIG. 3 is a perspective view of a second substrate of the sensor element in accordance with the exemplary embodiment.

FIG. 2 is an exploded perspective view of sensor element 101 in accordance with the exemplary embodiment. FIG. 3 is a perspective view of second substrate 131a of sensor element 101 in accordance with the exemplary embodiment. Herein, second substrate 131a is a wiring-buried glass substrate.

Second substrate 131a (wiring-buried glass substrate) of the present disclosure includes substrate 700 (glass substrate) and through-wiring 114a (first wiring).

Substrate 700 has first surface 141a, second surface 141b perpendicular to first surface 141a, and third surface 141c opposite to first surface 141a.

Figure 4:
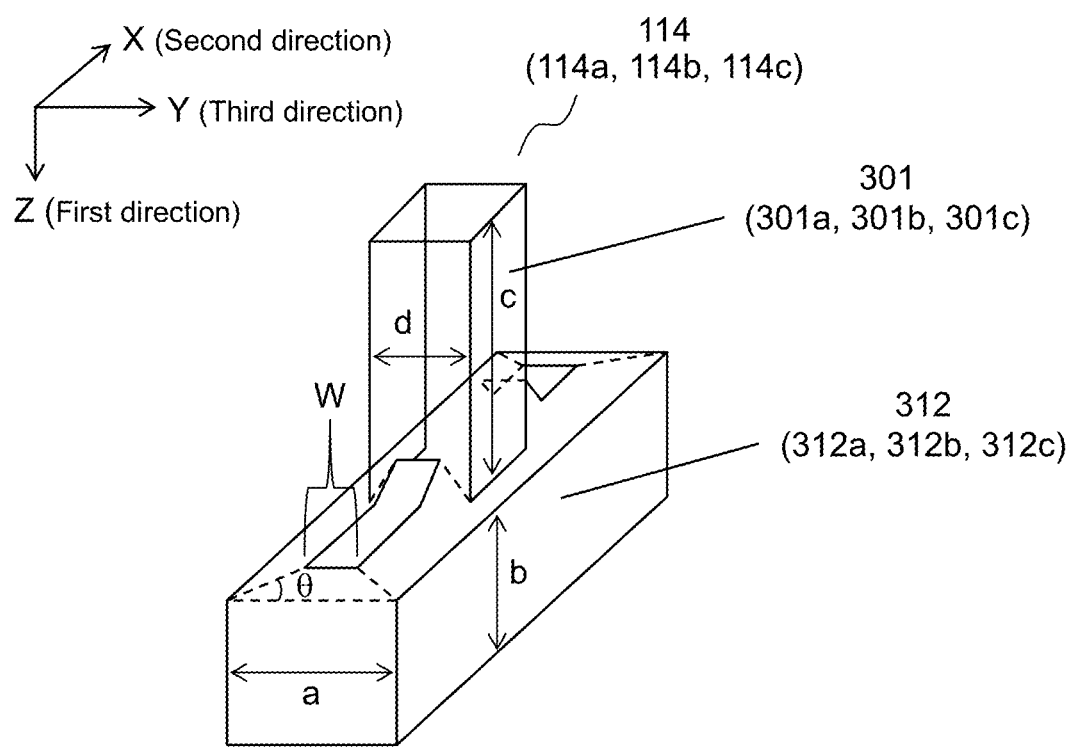
FIG. 4 is a schematic view of a through-wiring in accordance with the exemplary embodiment.

Through-wiring 114a includes first pillar portion 301a and first beam portion 312a (see FIGS. 2 and 4).

First pillar portion 301a extends in a first direction (Z-axis direction in FIG. 2) perpendicular to first surface 141a of substrate 700.

First beam portion 312a is connected to a first surface of first pillar portion 301a, and extends in a second direction (Y-axis direction in FIGS. 2 and 3) perpendicular to second surface 141b of substrate 700.

Through-wiring 114a is buried in substrate 700.

A first surface of the first beam portion is exposed from third surface 141c of substrate 700.

Hereinafter, sensor element 101 is further described in detail. As shown in FIG. 2, sensor element 101 has a structure in which first substrate 130 (a substrate for a sensor) is sandwiched between second substrate 131a and third substrate 131b. That is to say, sensor element 101 has a structure in which third substrate 131b, first substrate 130, and second substrate 131a are sequentially stacked on each other.

First substrate 130 includes weight portion 111 for detecting acceleration in the X-axis direction, and girder portions 112a and 112b for supporting weight portion 111 to support portion 113. As first substrate 130, a semiconductor substrate such as a SOI (Silicon on Insulator) substrate is used.

Second substrate 131a includes fixed electrodes 115a and 115c, and through-wirings 114a, 114b, and 114c. Through-wiring 114a (first wiring) is connected to fixed electrode 115a, and extracts an electric signal from fixed electrode 115a to the outside. Through-wiring 114c (third wiring) is connected to fixed electrode 115c, and extracts an electric signal from fixed electrode 115c to the outside. Through-wiring 114b (second wiring) is formed between through-wiring 114a and through-wiring 114c. Through-wiring 114b is connected to first substrate 130. Through-wiring 114b extracts electric potential of first substrate 130.

Substrate 700 constituting second substrate 131a includes, for example, glass.

Fixed electrodes 115a and 115c are, for example, a metal thin film such as an Al—Si film.

Third substrate 131b is disposed on package substrate 104. Third substrate 131b includes, for example, glass.

Through-wirings 114a, 114b, and 114c extend to both end surfaces of substrate 700. In other words, end surfaces of through-wirings 114a, 114b, and 114c are exposed from both side surfaces of substrate 700. An electric signal is extracted from one end portion of each of through-wirings 114a, 114b, and 114c.

Note here that end portions of through-wirings 114a, 114b, and 114c may be covered with metal plating for an electrode pad for connecting a metal wire.

Sensor element 101 includes a capacitor whose capacity is changed depending on acceleration, between weight portion 111 and fixed electrodes 115a and 115c. When acceleration is applied to weight portion 111, girder portions 112a and 112b are twisted and weight portion 111 is displaced. Thus, an area and an interval in which fixed electrodes 115a and 115c face weight portion 111 are changed, and electrostatic capacitance of the capacitor is changed. Sensor element 101 detects acceleration from a change of the electrostatic capacitance.

Note here that this exemplary embodiment describes sensor element 101 for detecting acceleration in the X-axis direction. However, the present invention is not limited to this, and may be, for example, an acceleration sensor element for detecting acceleration in the Y-axis direction or the Z-axis direction, or an angular velocity sensor element for detecting an angular velocity around the X-axis, Y-axis, and Z-axis. That is to say, sensor element 101 is used as an inertial sensor element. Furthermore, when an angular velocity sensor element for detecting an angular velocity is used, it is used for an angular velocity sensor. Furthermore, sensor 100 is used as an inertial sensor.

FIG. 4 is a schematic view (expanded perspective view) of through-wiring 114 in accordance with the exemplary embodiment. Herein, through-wiring 114 shows any one of through-wirings 114a, 114b, and 114c. That is to say, since basic structures of through-wirings 114*a*, 114*b*, and 114*c* are the same as each other, through-wirings 114*a*, 114*b*, and 114*c* are described using through-wiring 114. In order to simplify the illustration, through-wiring 114 of FIG. 4 is shown such that through-wirings 114*a*, 114*b*, and 114*c* of FIG. 2 are shown with the top and bottom reversed.

Through-wiring 114 includes pillar portion 301 (first portion) and beam portion 312 (second portion). Pillar portion 301 and beam portion 312 form a T-shape. Pillar portion 301 and beam portion 312 are electrically connected to each other. That is to say, through-wiring 114*a* is composed of pillar portion 301*a* (first pillar portion) and beam portion 312*a* (first beam portion). Through-wiring 114*b* is composed of pillar portion 301*b* (second pillar portion) and beam portion 312*b* (second beam portion). Through-wiring 114*c* is composed of pillar portion 301*c* (third pillar portion) and beam portion 312*c* (third beam portion). A material of through-wiring 114 is, for example, silicon.

Pillar portion 301*a* of through-wiring 114*a* is electrically connected to fixed electrode 115*a*. Pillar portion 301*c* of through-wiring 114*c* is electrically connected to fixed electrode 115*c*.

As shown in FIG. 3, second substrate 131*a* (substrate 700) has first surface 141*a*, second surface 141*b*, and third surface 141*c*. First surface 141*a* is a surface to be provided with fixed electrodes 115*a* and 115*c*. In other words, first surface 141*a* is a surface facing weight portion 111. Second surface 141*b* is a surface perpendicular to first surface 141*a*. Third surface 141*c* is a surface opposite to first surface 141*a*.

Pillar portion 301 extends in a direction perpendicular to first surface 141*a* of substrate 700 (in the Z-axis direction of FIG. 2, a first direction). In other words, pillar portion 301 extends in parallel to second surface 141*b* of substrate 700.

Beam portion 312 extends in a direction in parallel to first surface 141*a* of substrate 700 (in the X-axis direction of FIG. 2, a second direction). In other words, beam portion 312 extends perpendicular to surface 141*b* of substrate 700. Beam portion 312 is formed such that it divides substrate 700 on third surface 141*c*.

As shown in FIG. 4, a width W of beam portion 312 facing first surface 141*a* is made to be narrower than a width a of beam portion 312 facing second surface 141*b*.

Furthermore, the inclination θ in beam portion 312 facing first surface 141*a* is determined depending on the height b of beam portion 312. In this exemplary embodiment, the inclination θ is in a range of 10° or more and 45° or less.

A width a of beam portion 312 is in a range of 100 μm or more and 200 μm or less. A height b of beam portion 312 is in a range of 100 μm or more and 200 μm or less. A width d of pillar portion 301 is smaller than the width a of beam portion 312. The height c of pillar portion 301 is in a range of 100 μm or more and 200 μm or less.

Through-wiring 114 is formed of a single member. That is, pillar portion 301 and beam portion 312 are formed as a continuous body. Alternatively, pillar portion 301 and beam portion 312 are unitarily formed with each other. With this configuration, the size of sensor element 101 can be reduced. Furthermore, since the inclination θ is provided, casting of glass is facilitated in a step of burying through-wiring 114 in glass. As a result, even when the wiring interval of through-wirings 114*a*, 114*b*, and 114*c* is small, defects such as voids do not tend to occur.

Furthermore, since the presence of inclination θ increases a surface area on which glass and silicon are brought into contact with each other, adhesion force between glass and silicon is improved. Therefore, strength of sensor element 101 is improved.

Furthermore, as shown in FIG. 4, the width a is made to be larger than the width d. In other words, the width d of pillar portion 301 in a third direction is smaller than the width a of beam portion 312 in a third direction. Herein, a direction in which pillar portion 301 extends is defined as a first direction (Z-axis direction), and a direction in which beam portion 312 extends is defined as a second direction (X-axis direction). A direction perpendicular to both the first direction and the second direction is defined as a third direction (Y-axis direction).

Since this configuration enables pillar portion 301 to incline on a bonding surface to beam portion 312, the above-mentioned effect can be obtained. In addition, in a manufacturing step of through-wiring 114, even when some alignment displacement occurs at the time of formation of pillar portion 301, it is possible to secure T-shape made by pillar portion 301 and beam portion 312. That is, since robustness with respect to the alignment accuracy is improved, a through-wiring pattern can be reduced in size.

Figure 5:
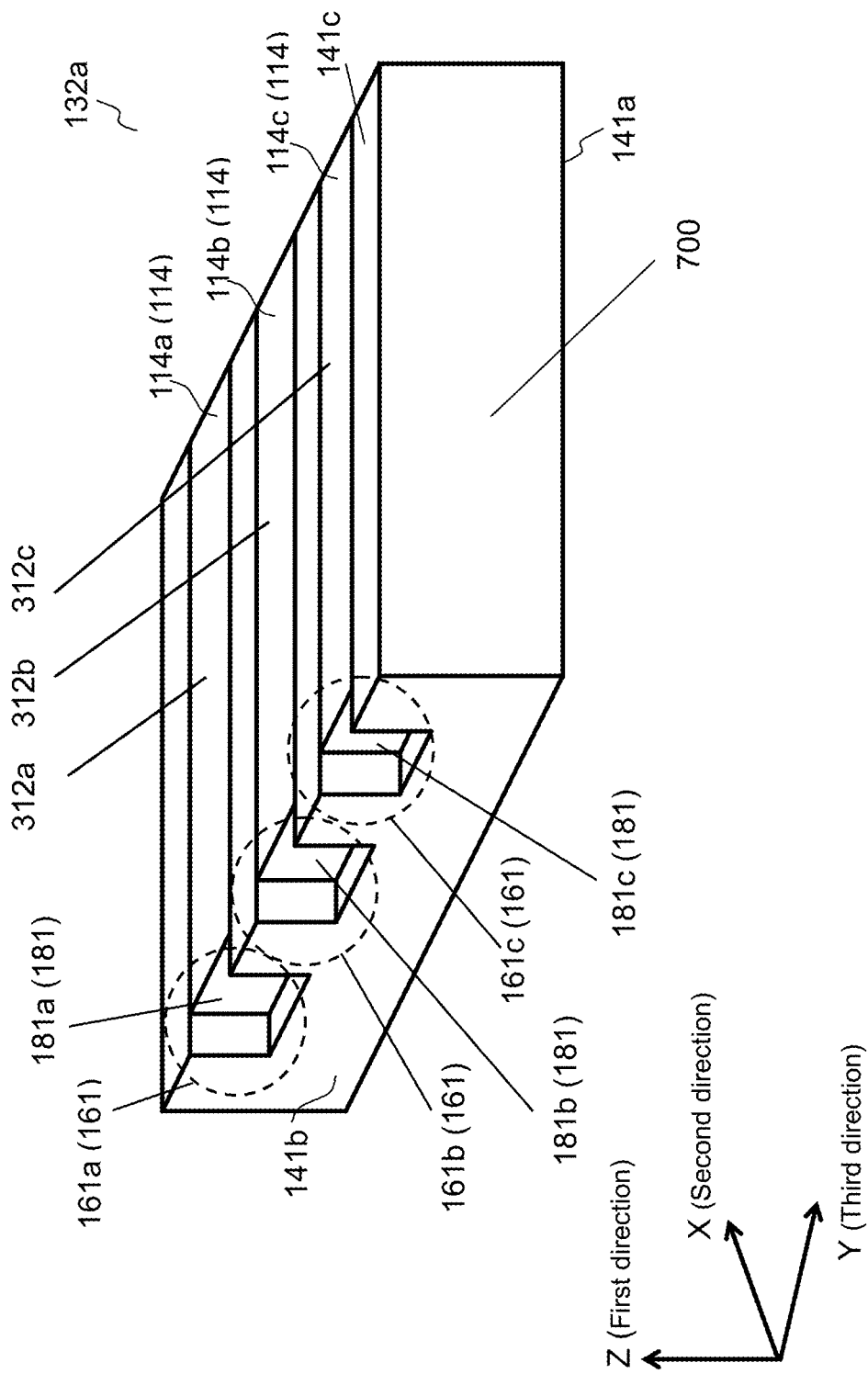
FIG. 5 is a perspective view of another second substrate of the sensor element in accordance with the exemplary embodiment.
Figure 6:
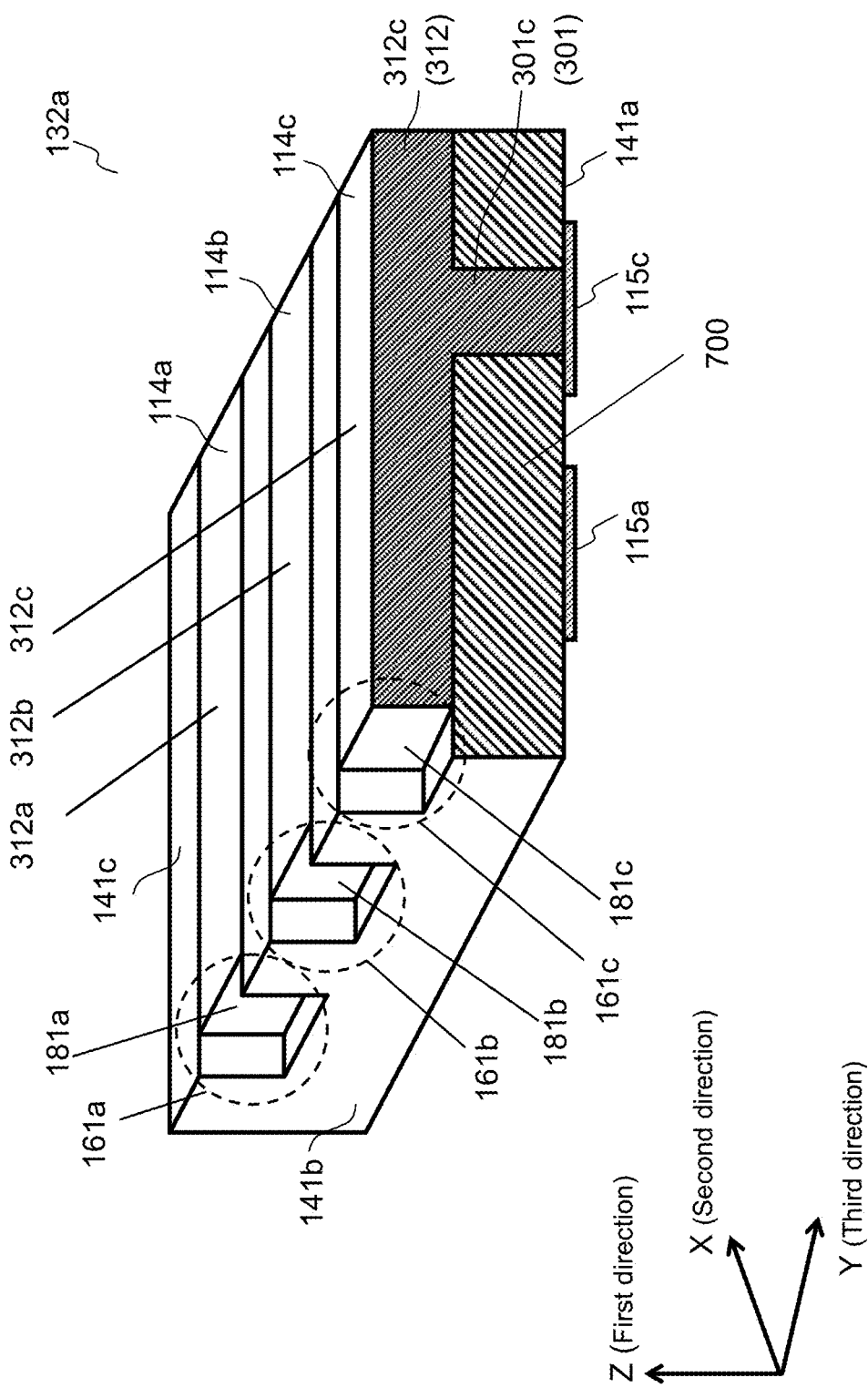
FIG. 6 is a sectional view of the other second substrate of the sensor element in accordance with the exemplary embodiment.

FIG. 5 is a perspective view of another second substrate 132*a* in accordance with the exemplary embodiment. FIG. 6 is a sectional view of the other second substrate 132*a* in accordance with the exemplary embodiment. Second substrate 132*a* is different from second substrate 131*a* in that one end of each of through-wirings 114*a*, 114*b*, and 114*c* of second substrate 132*a* does not extend to second surface 141*b*. The other configurations of second substrate 132*a* are the same as those of second substrate 131*a*.

In more detail, when second substrate 132*a* is seen from third surface 141*c*, third surface 141*c* has recess portion 161*c*, and one surface of recess portion 161*c* is formed of one end surface 181*c* of beam portion 312*c*.

In another expression, one end surface 181*c* of beam portion 312*c* of through-wiring 114*c* does not extend to second surface 141*b*. That is to say, one end surface 181*c* of beam portion 312*c* and second surface 141*b* are not flush with each other. In other words, one end surface 181*c* of beam portion 312*c* of through-wiring 114*c* is provided to be recessed with respect to second surface 141*b*. This recessed region is defined as recess portion 161*c*.

Similarly, when second substrate 132*a* is seen from third surface 141*c*, third surface 141*c* has recess portion 161*a*. One surface of recess portion 161*a* is formed of one end surface 181*a* of beam portion 312*a*.

In another expression, one end surface 181*a* of beam portion 312*a* of through-wiring 114*a* does not extend to second surface 141*b*. That is to say, one end surface 181*a* of beam portion 312*a* and second surface 141*b* are not flush with each other. In other words, one end surface 181*a* of beam portion 312*a* of through-wiring 114*a* is provided to be recessed with respect to second surface 141*b*. This recessed region is defined as recess portion 161*a*.

Similarly, when second substrate 132*a* is seen from third surface 141*c*, third surface 141*c* has recess portion 161*b*. One surface of recess portion 161*b* is formed of one end surface 181*b* of beam portion 312*b*.

In another expression, one end surface 181*b* of beam portion 312*b* of through-wiring 114*b* does not extend to second surface 141*b*. That is, one end surface 181*b* of beam portion 312*b* and second surface 141*b* are not flush with each other. In other words, one end surface 181*b* of beam portion 312*b* of through-wiring 114*b* is provided to be recessed with respect to second surface 141*b*. This recessed region is defined as recess portion 161*b*.

Recess portion 161 is a region surrounded by three surfaces formed of substrate 700, and one surface formed of wiring material constituting through-wiring 114. Herein, recess portion 161 shows any one of recess portion 161a, recess portion 161b, and recess portion 161c. In this exemplary embodiment, a material constituting substrate 700 is glass. Furthermore, a wiring material constituting through-wiring 114 is silicon. In another expression, recess portion 161 is a region (recess portion) surrounded by three surfaces formed in a vicinity of end surfaces of substrate 700, and end surface 181 of through-wiring 114. Herein, end surface 181 shows any one of end surfaces 181a, 181b, and 181c.

With the above-mentioned configuration, regardless of whether second surface 141b of second substrate 132a is disposed facing upward, or disposed facing laterally, an electric signal can be extracted easily.

It is preferable that one end surface 181 of beam portion 312 of through-wiring 114 is provided with a layer of metal such as gold. Furthermore, it is more preferable that the inner surface of recess portion 161 is provided with a layer of metal such as gold. In other words, it is more preferable that three surfaces formed of substrate 700 and one end surface 181 of through-wiring 114, which form recess portion 161, are provided with a layer of metal such as gold.

With this configuration, recess portion 161 can be used as, for example, a metal pad for wire bonding. All of the four inner surfaces constituting recess portion 161 are covered with a metal layer. Thus, in second substrate 132a, regardless of whether second surface 141b is disposed facing upward, or disposed facing laterally, a metal surface always appears at the top surface. Therefore, regardless of whether second surface 141b is disposed facing upward or laterally, an electric signal can be easily extracted to the outside.

In addition, when second surface 141b of second substrate 132a is disposed facing upward, since the metal surface forms recess portion 161, the height of the metal wire for extracting an electric signal to the outside can be lower than that of second surface 141b of substrate 700. Consequently, package substrate 104 can be reduced in size.

Furthermore, since all of the four inner surfaces constituting recess portion 161 are covered with a metal layer, the electrical connection reliability of wire bonding is improved.

This exemplary embodiment mentions that recess portion 161 is a region surrounded by three inner surfaces formed of substrate 700, and one inner surface formed of through-wiring 114. However, recess portion 161 is not necessarily limited to this. For example, recess portion 161 may be a region surrounded by four inner surfaces formed of substrate 700, and one inner surface formed of through-wiring 114. In this case, since recess portion 161 is a depression whose four sides are surrounded, recess portion 161 can be used when joining metal or an conductive adhesive are poured at the time of mounting. However, recess portion 161 is preferably a region surrounded by three inner surfaces formed of substrate 700 and one inner surface formed of through-wiring 114. That is, recess portion 161 is preferably a depression with three sides surrounded. As mentioned above, this makes it easy to extract an electric signal.

Furthermore, through-wirings 114a, 114b, and 114c are formed in parallel to each other in second substrate 132a. This can improve symmetric property of second substrate 132a, so that temperature characteristics of a sensor using second substrate 132a can be improved.

Figure 7:
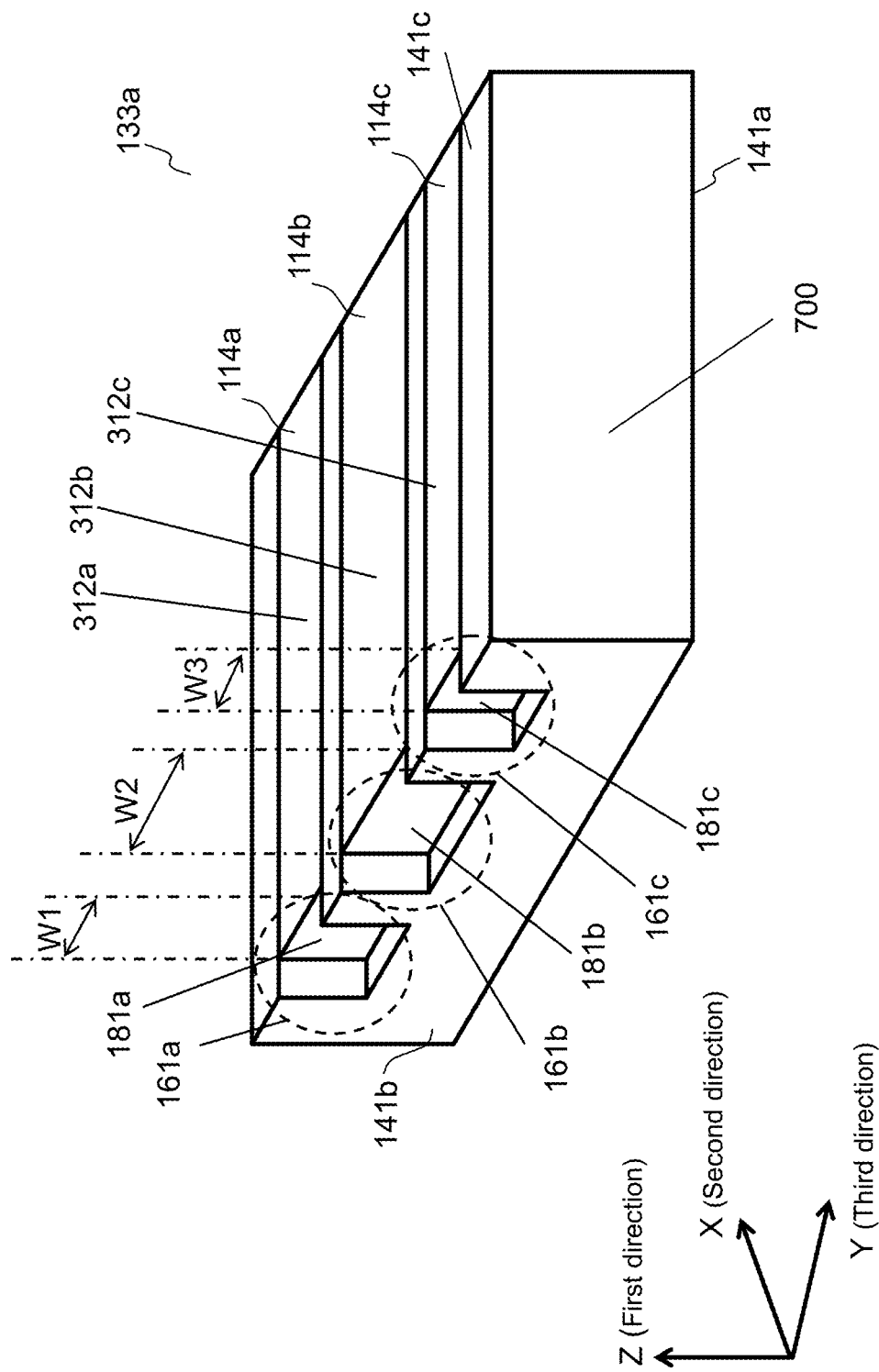
FIG. 7 is a perspective view of still another second substrate of the sensor element in accordance with the exemplary embodiment.

FIG. 7 is a perspective view of a still another second substrate 133a in accordance with the exemplary embodiment. Second substrate 133a is different from second substrate 132a in that widths of through-wirings 114a, 114b, and 114c are not the same as each other. The other configurations of second substrate 133a are the same as those in second substrate 132a.

A width W2 at an end portion of beam portion 312b of through-wiring 114b is larger than a width W1 at an end portion of beam portion 312a of through-wiring 114a.

Furthermore, the width W2 at the end portion of beam portion 312b of through-wiring 114b is preferably larger than a width W3 at the end portion of beam portion 312c of through-wiring 114c. This relieves alignment accuracy required when wire bonding to beam portion 312b of through-wiring 114b is carried out.

Furthermore, the width W1 at the end portion of beam portion 312a of through-wiring 114a is preferably equal to the width W3 at the end portion of beam portion 312c of through-wiring 114c. Thus, since the symmetric property of second substrate 131a can be improved, temperature characteristics of the sensor using second substrate 131a are improved.

Furthermore, the structure of through-wiring 114 described in FIG. 7 may be applied to FIG. 3. In addition, the structure of through-wiring 114 described in FIG. 7 and the structure described in FIGS. 3 and 5 may be combined.

Furthermore, this exemplary embodiment describes T-shaped through-wiring 114. However, the shape of through-wiring 114 is not necessarily limited to a T-shape. For example, the through-wiring having an L-shape or combination of a T-shape and an L-shape may be used. Furthermore, through-wiring may have an I-shape. However, a T-shape improves the symmetric property, so that temperature characteristics of sensor 100 are improved. Therefore, a T-shape is preferable for the through-wiring.

FIG. 8 is an exploded perspective view of sensor element 201 in accordance with the exemplary embodiment. Sensor element 201 is different from sensor element 101 in that second substrate 131a has through-wirings 114a, 114b, 114c, and 114d. The other configurations are the same as those in sensor element 101.

Through-wiring 114a is connected to first fixed electrode 115a. Through-wiring 114c is connected to first fixed electrode 115c. Through-wirings 114b and 114d are connected to first substrate 130.

Since two places, that is, through-wiring 114b and through-wiring 114d are connected to first substrate 130, an electric potential can be stably extracted from first substrate 130. Therefore, reliability of sensor element 201 is improved. In addition, since symmetric property of second substrate 131a can be improved, temperature characteristics of sensor element 201 using second substrate 131a can be improved.

FIG. 9A is a top view of second substrate 331a of sensor element 300 in accordance with the exemplary embodiment. FIG. 9B is a front view of second substrate 331a of sensor element 300 in accordance with the exemplary embodiment. FIG. 9C is a top view of first substrate 330 of sensor element 300 in accordance with the exemplary embodiment. FIG. 9D is a front view of first substrate 330 of sensor element 300 in accordance with the exemplary embodiment. FIG. 9E is a top view of third substrate 331b of sensor element 300 in accordance with the exemplary embodiment. FIG. 9F is a front view of third substrate 331b of sensor element 300 in accordance with the exemplary embodiment. As shown in FIG. 9A, a length of each of through-wirings 114a and 114c is different from through-wiring 114b in second substrate 331a.

Fixed electrode 115a of second substrate 331a provided at a joining surface side to first substrate 330 is electrically joined to through-wiring 114a. Fixed electrode 115c of second substrate 331a provided at a joining surface side to the first substrate is electrically joined to through-wiring 114c.

Insulating layers 202a and 202b and first electrodes 204a and 204b are disposed in recess portion 206. A place at the outer side of recess portion 206 of first substrate 330 is connected to second substrate 331a.

First electrode 204a is provided on insulating layer 202a in recess portion 206 of first substrate 330. Second electrode 204b is provided on insulating layer 202b in recess portion 206 of first substrate 330. Surfaces of first electrode 204a and second electrode 204b preferably protrude slightly from the surface of first substrate 330. The protruding heights thereof are preferably approximately 1.0 µm or less. This allows first electrode 204a and second electrode 204b to be reliably pressure-bonded when first substrate 330 and second substrate 331a are joined. As a result, reliability of connection between first substrate 330 and second substrate 331a is improved.

Island portion 202c is an island-shaped portion provided in recess portion 206 of first substrate 330, and made of the same material as that of first substrate 330. Third electrode 204c is formed on island portion 202c. First substrate 330 and second substrate 331a are joined to each other, and then third electrode 204c is connected to through-wiring 114b. That is, electric potential of first substrate 330 can be extracted with through-wiring 114b.

It is preferable that the surface of third electrode 204c slightly protrudes from the surface of first substrate 330. The protruding height is approximately 1.0 µm or less. This configuration allows third electrode 204c to be pressure-bonded when first substrate 330 and second substrate 331a are joined to each other, and more reliable electric connection to be achieved.

Herein, first electrode 204a, second electrode 204b, and third electrode 204c are disposed such that they form a triangular shape seen in the top view. This improves symmetric property of first substrate 330, so that temperature characteristics of sensor element 300 is improved.

FIGS. 10A to 10F are views showing manufacturing steps of second substrate 331a of sensor element 300 in accordance with the exemplary embodiment, particularly showing the steps for forming recess portions 161a, 161b, and 161c of second substrate 331a.

In a resist application step shown in FIG. 10A, resist 604 is applied on the top surface of base material 171 in which silicon 602 is fitted into glass 600. At this time, a part of the through-wiring exposing from the top surface is not provided with resist 604. Note here that glass 600 is a material constituting substrate 700. Silicon is a material constituting through-wiring 114.

In an etching step shown in FIG. 10B, base material 171 is etched. At this time, a place that is not provided with resist 604 of base material 171 is etched. Thus, recess portion 606 is formed in base material 171.

In an electrode sputtering step shown in FIG. 10C, metal layer 608 is formed by sputtering on the top surface of base material 171.

In a resist peeling step shown in FIG. 10D, the resist is peeled off. With this step, metal layer 608 in a part except for recess portion 606 is removed.

In a dicing step shown in FIG. 10E, base material 171 is subjected to dicing along broken line 10F-10F, that is, a line that passes through recess portion 606. FIG. 10F is a perspective view after dicing. In the steps mentioned above, second substrate 331a is formed.

Figure 11A:
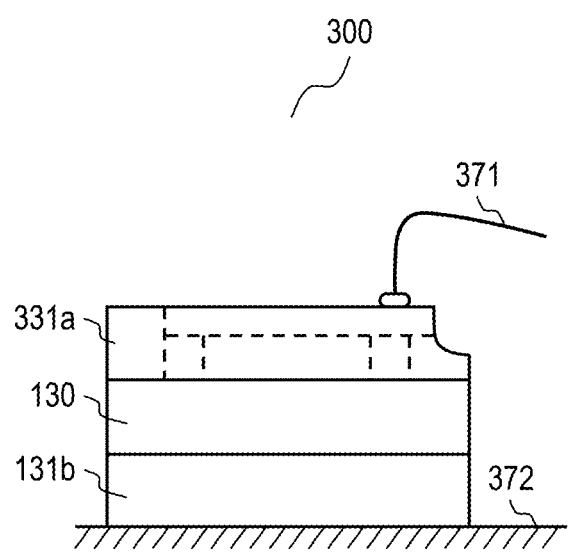
FIG. 11A is a side schematic view of a sensor element when it is placed in a landscape orientation in accordance with the exemplary embodiment.
Figure 11B:
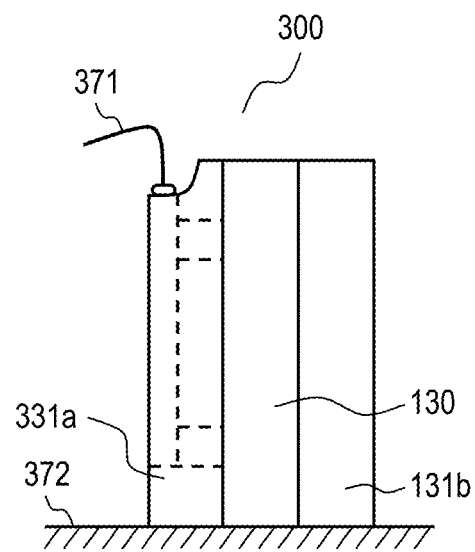
FIG. 11B is a side schematic view of the sensor element when it is placed in a portrait orientation in accordance with the exemplary embodiment.

FIG. 11A is a side schematic view of sensor element 300 when it is placed in a landscape orientation in accordance with the exemplary embodiment. FIG. 11B is a side schematic view of sensor element 300 when it is placed in a portrait orientation in accordance with the exemplary embodiment.

As shown in FIGS. 11A and 11B, regardless of whether sensor element 300 is placed in portrait or landscape orientation with respect to outer substrate 372, metal wire 371 can be pulled out. Since this structure makes it easy to extract an electric signal, the degree of freedom of disposing sensor element 300 is improved. Note here that this configuration can be applied to not only second substrate 331a, but also to second substrate 132a or second substrate 133a.

FIG. 12A is a top view of sensor element 350 in accordance with the exemplary embodiment. FIG. 12B is a front view of sensor element 350 in accordance with the exemplary embodiment. FIG. 12C is a side view of sensor element 350 in accordance with the exemplary embodiment.

Second substrate 431a of sensor element 350 shown in FIGS. 12A to 12C has a configuration in which electrode layer 374 is formed by sputtering on second substrate 331a of sensor element 300 shown in FIG. 9A. In addition first groove portion 302a is formed between through-wiring 114a and through-wiring 114b. Furthermore, second groove portion 302b is formed between through-wiring 114c and through-wiring 114b. Note here that first groove portion 302a and second groove portion 302b are formed by subjecting electrode layer 374 and substrate 700 to cutting work by using, for example, technique such as laser or half-dicing.

Sensor element 350 has a structure in which third substrate 431b, first substrate 430, and second substrate 431a are sequentially stacked on each other. Recess portion 361a, recess portion 361b, and recess portion 361c have an inner surface made of a material constituting substrate 700 and a material constituting through-wiring 114. In this exemplary embodiment, the substrate material is glass, and the wiring material is silicon. In other words, recess portions 361a, 361b, and 361c are respectively a region surrounded by three inner surfaces that are end surfaces of substrate 700 and one inner surface that is an end surface of through-wiring 114.

Electrode layer 374 is provided to at least a part of third surface 141c of second substrate 131a (substrate 700) and at least a part of the inner surface of recess portion 361 (recess portion 361a, recess portion 361b, and recess portion 361c). Electrode layer 374 is formed of, for example, gold.

A length L1 of recess portion 361 in a direction perpendicular to third surface 141c (in the Z-axis direction in FIG. 12B) is longer than a length L2 of beam portion 312 of through-wiring 114 in the direction perpendicular to third surface 141c (in the Z-axis direction in FIG. 12B). Herein, recess portion 361 shows any one of recess portion 361a, recess portion 361b, and recess portion 361c. However, the length L1 may be smaller than the length L2 as long as recess portions 361a, 361b, and 361c have an area necessary for wire bonding. However, since too small length L1 makes electrical connection instable, the length L1 is preferably longer than the length L2.

Sensor element 350 has first groove portion 302a and second groove portion 302b on third surface 141c of second substrate 131a (substrate 700).

First groove portion 302a is formed in an approximately middle position between 114a and 114b. Second groove portion 302b is formed in an approximately middle position between 114b and 114c. Depths D1 of first groove portion 302a and second groove portion 302b are desirably deeper by 10 µm or more than the length L1 of recess portion 361.

That is to say, it is desirable that the length (depth D1) of first groove portion 302a or second groove portion 302b in the direction perpendicular to third surface 141c is longer than the length L1 of recess portion 361a in the direction perpendicular to third surface 141c. Furthermore, first groove portion 302a may extend through between third surface 141c and first surface 141a. Widths H1 of first groove portion 302a and second groove portion 302b are desirably approximately 20 μm or more. Furthermore, a gap between first groove portion 302a and second groove portion 302b and through-wirings 114a to 114c is desirably 10 μm or more. This can make through-wirings 114a to 114c to be electrically independent from each other, through-wirings 114a and 114b are one acceleration detection capacity electrode, and through-wirings 114b and 114c are the other acceleration detection capacity electrode.

FIG. 13A is a top view of sensor element 400 in accordance with the exemplary embodiment. FIG. 13B is a front view of sensor element 400 in accordance with the exemplary embodiment. FIG. 13C is a side view of sensor element 400 in accordance with the exemplary embodiment. Sensor element 400 and sensor element 350 are different from each other in shapes of through-wirings.

Sensor element 400 includes columnar-shaped through-wirings 414a, 414b, and 414c. Through-wirings 414a, 414b, and 414c penetrate through second substrate 131a (substrate 700). Through-wirings 414a, 414b, and 414c each have only a pillar portion extending in the first direction (in the Z-axis direction of FIG. 13B) instead of having a T-shape. Description is given with reference to FIG. 4, through-wirings 414a, 414b, and 414c have a configuration which does not have beam portion 312, and have only pillar portion 301. Each of pillar portions 301a, 301b, and 301c of each of through-wirings 414a, 414b, and 414c has one end exposed from third surface 141c of second substrate 131a (substrate 700).

Electrode layer 374 is formed in at least a part of third surface 141c of second substrate 131a (substrate 700) and at least a part of the inner surface of recess portion 361a. Herein, electrode layer 374 is continuously formed between third surface 141c and recess portion 361a.

Figure 14A:
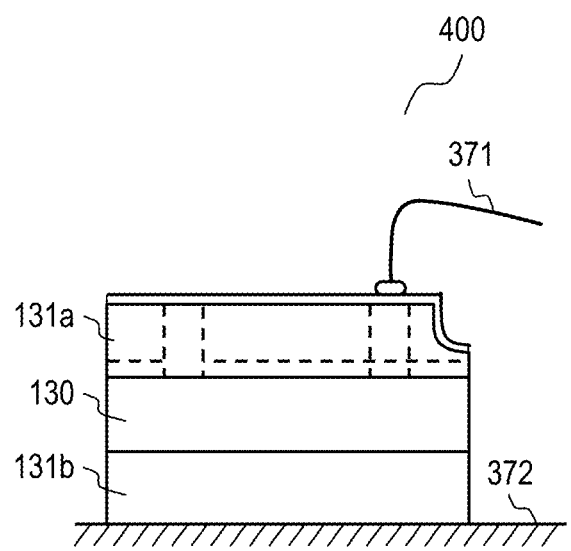
FIG. 14A is a side schematic view of the further sensor when it is placed in a landscape orientation in accordance with the exemplary embodiment.
Figure 14B:
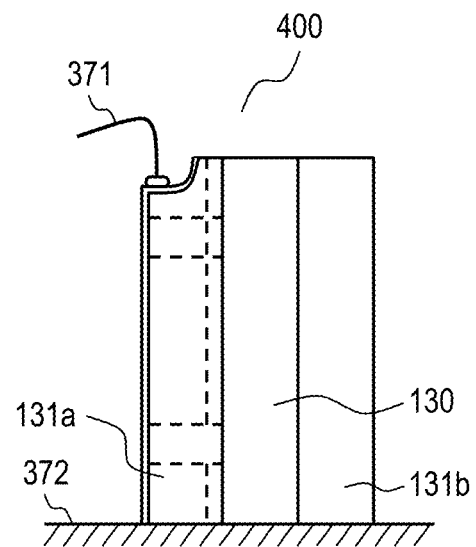
FIG. 14B is a side schematic view of the further sensor when it is placed in a portrait orientation in accordance with the exemplary embodiment.

FIG. 14A is a side schematic view of sensor element 400 when it is placed in a landscape orientation in accordance with the exemplary embodiment. FIG. 14B is a side schematic view of sensor element 400 when it is placed in a portrait orientation in accordance with the exemplary embodiment. FIGS. 14A and 14B show sensor element 400 on which metal wire 371 is mounted.

As shown in FIG. 14, metal wire 371 can be pulled out regardless of whether sensor element 400 is placed in portrait or landscape orientation with respect to outer substrate 372. As a result, an electric signal can be easily extracted, and therefore, the degree of freedom of disposing sensor element 400 is improved.

Figure 15:
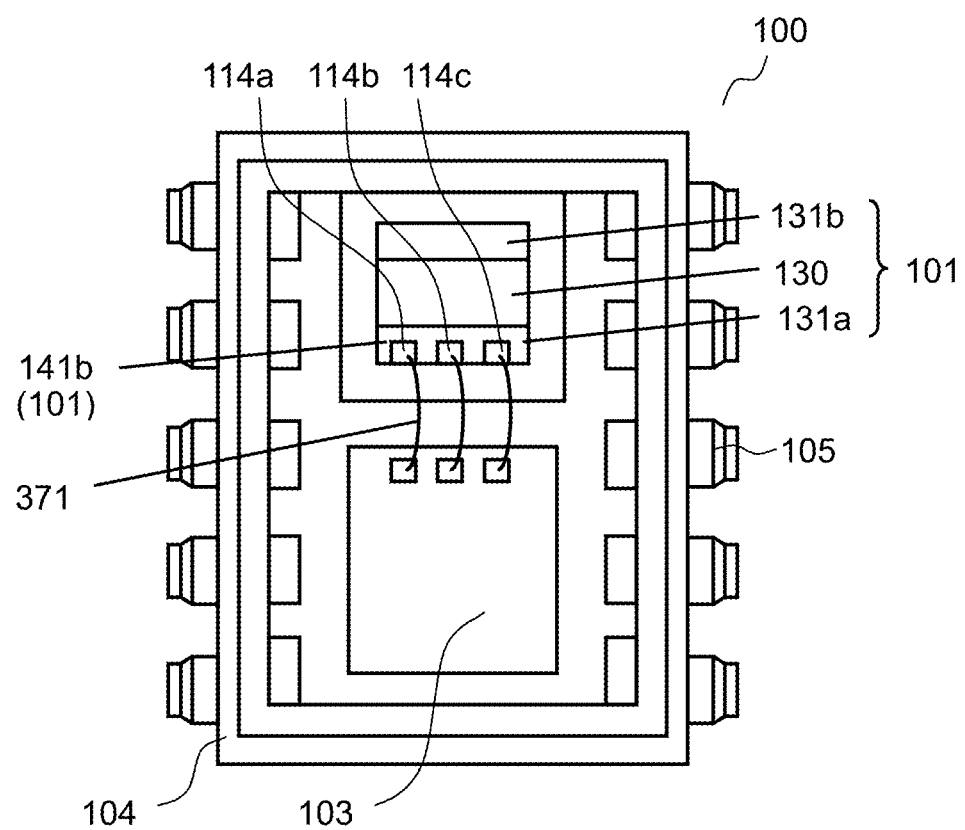
FIG. 15 is a top view of a sensor in accordance with the exemplary embodiment.

FIG. 15 is a top view of sensor 100 in accordance with the exemplary embodiment. In FIG. 15, sensor element 101 is disposed such that second surface 141b is exposed seen in a top view. That is to say, sensor element 101 in FIG. 15 is disposed as in FIGS. 11B and 14B. Metal wire 371 is connected to the end portions of through-wirings 114a, 114b, and 114c exposed seen in a top view. Sensor element 101 is connected to circuit board 103 via metal wire 371.

Figure 16:
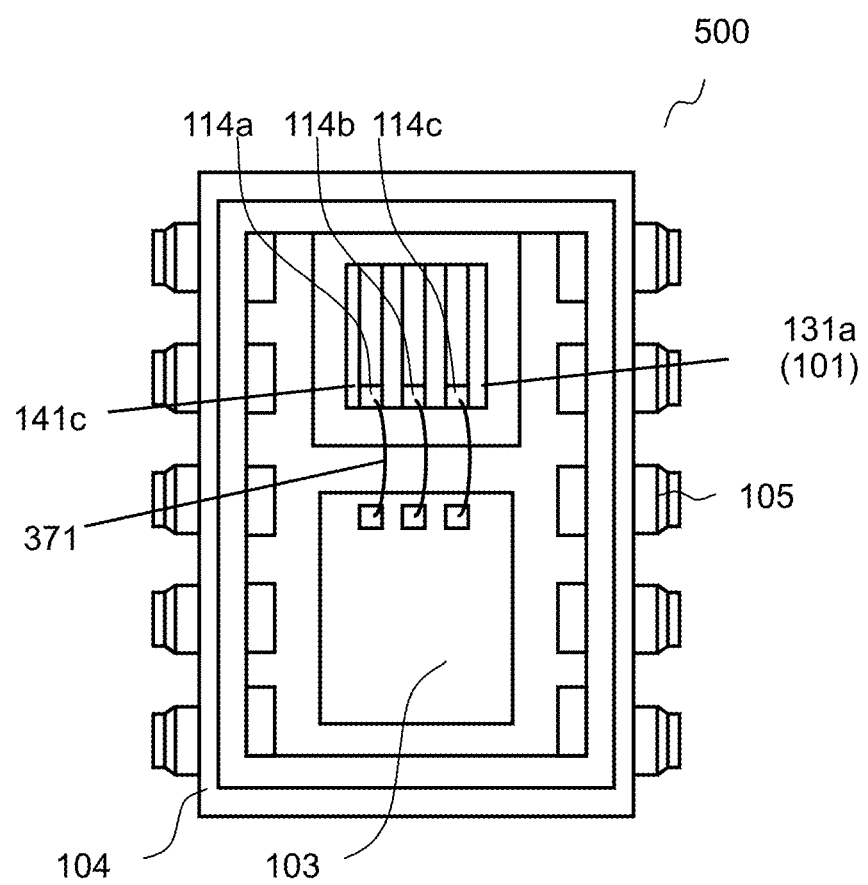
FIG. 16 is a top view of another sensor in accordance with the exemplary embodiment.

FIG. 16 is a top view of another sensor 500 in accordance with the exemplary embodiment. In FIG. 16, sensor element 101 is disposed such that third surface 141c is exposed seen in a top view. That is to say, sensor element 101 in FIG. 16 is disposed as shown in FIGS. 11A and 14A. Metal wire 371 is connected to the end portions of through-wirings 114a, 114b, and 114c exposed seen in a top view. Sensor element 101 is connected to circuit board 103 via metal wire 371.

FIGS. 15 and 16 describe sensor element 101 as an example, but sensor elements 201, 300, 350, and 400 can be also disposed similarly.

As shown in FIGS. 15 and 16, a sensor element of the present disclosure may be placed in a portrait orientation or in a landscape orientation. As a result, the degree of freedom of disposing of a sensor element is improved.

Note here that in the description of this exemplary embodiment, three through-wirings 114a, 114b, and 114c are used, but the number of through-wirings is not necessarily limited to three, and may be any numbers.

With a sensor using a sensor element of the present disclosure, the degree of freedom of disposing is improved, thus making it easy to extract an electric signal to the outside.

INDUSTRIAL APPLICABILITY

The present disclosure is useful for a wiring-buried glass substrate, and an inertial sensor element and an inertial sensor using the wiring-buried glass substrate.

REFERENCE MARKS IN THE DRAWINGS 100, 500 sensor
101, 201, 300, 350, 400 sensor element
103 circuit board
104 package substrate
105 lead terminal
106 outer substrate
111 weight portion
113 support portion
112a, 112b girder portion
114, 114a, 114b, 114c, 114d through-wiring
115a, 115c fixed electrode
130, 330, 430 first substrate
131a, 132a, 133a, 331a, 431a second substrate
131b, 331b, 431b third substrate
141a first surface
141b second surface
141c third surface
161, 161a, 161b, 161c, 361, 361a, 361b, 361c recess portion
171 base material
181, 181a, 181b, 181c end surface
202a, 202b insulating layer
202c island portion
204a first electrode
204b second electrode
204c third electrode
206 recess portion
301, 301a, 301b, 301c pillar portion
302a first groove portion
302b second groove portion
312, 312a, 312b, 312c beam portion
371 metal wire
372 outer substrate
374 electrode layer
414a, 414b, 414c through-wiring
600 glass
602 silicon
604 resist
606 recess portion
608 metal layer
700 substrate
W, W1, W2, W3 width L1, L2 length
θ inclination
a, d width
c, b height
H1 width

The invention claimed is:

1. A wiring-buried glass substrate comprising:
a glass substrate including:
a first surface,
a second surface perpendicular to the first surface, and
a third surface opposite to the first surface; and
a first wiring including:
a first pillar portion extending in a first direction perpendicular to the first surface of the glass substrate, and
a first beam portion connected to a first surface of the first pillar portion and extending in a second direction perpendicular to the second surface of the glass substrate,
wherein the first beam portion includes a first surface, a second surface, a third surface, and a fourth surface, the first surface, the second surface, the third surface, and the fourth surface of the first beam portion extending along the second direction,
the second surface of the first beam portion is perpendicular to the first surface of the first beam portion,
the third surface of the first beam portion is opposite to the first surface of the first beam portion,
the fourth surface of the first beam portion is opposite to the second surface of the first beam portion,
the first wiring is buried in the glass substrate,
the first surface of the first beam portion is exposed from the third surface of the glass substrate, and
the second surface, the third surface, and the fourth surface of the first beam portion are not exposed from the third surface of the glass substrate.

2. The wiring-buried glass substrate of claim 1,
wherein the first beam portion further includes an end surface perpendicular to the second direction, and
the third surface of the glass substrate includes a first recess portion, and one surface of the first recess portion is formed of the end surface of the first beam portion.

3. The wiring-buried glass substrate of claim 2, further comprising:
a second wiring including:
a second pillar portion extending in the first direction perpendicular to the first surface of the glass substrate, and
a second beam portion connected to a first surface of the second pillar portion, and extending in the second direction perpendicular to the second surface of the glass substrate,
wherein the second wiring is buried in the glass substrate,
a first surface of the second beam portion is exposed from the third surface of the glass substrate,
the third surface of the glass substrate has a second recess portion, and
one surface of the second recess portion is formed of one end surface of the second beam portion.

4. The wiring-buried glass substrate of claim 3, wherein
a part of the third surface of the glass substrate, the first recess portion, and the second recess portion are covered with an electrode layer, and
a groove portion that is not provided with the electrode layer is formed between the first wiring and the second wiring on the third surface of the glass substrate.

5. The wiring-buried glass substrate of claim 4, wherein a length of the groove portion in the first direction is longer than a length of the first recess portion in the first direction.

6. The wiring-buried glass substrate of claim 4, wherein the groove portion extends through between the third surface and the first surface of the glass substrate.

7. The wiring-buried glass substrate of claim 3, wherein when a direction perpendicular to both the first direction and the second direction is defined as a third direction, a width of the first beam portion and a width of the second beam portion in the third direction are different from each other.

8. The wiring-buried glass substrate of claim 2, wherein a length of the first recess portion in the first direction is longer than a length of the first beam portion in the first direction.

9. The wiring-buried glass substrate of claim 2, wherein a part of the third surface of the glass substrate and the first recess portion are covered with an electrode layer.

10. An inertial sensor element comprising:
the wiring-buried glass substrate of claim 1; and
a substrate for a sensor, including:
a weight portion;
a support portion; and
a girder portion that supports the weight portion to the support portion, wherein the substrate for a sensor is connected to the wiring-buried glass substrate.

11. An inertial sensor comprising:
the inertial sensor element of claim 10;
a detection circuit for detecting a physical quantity based on an output from the inertial sensor element; and
a package substrate including the inertial sensor element and the detection circuit.

12. A wiring-buried glass substrate comprising:
a glass substrate including:
a first surface,
a second surface perpendicular to the first surface, and
a third surface opposite to the first surface;
a first wiring including:
a first pillar portion extending in a first direction perpendicular to the first surface of the glass substrate, and
a first beam portion connected to a first surface of the first pillar portion and extending in a second direction perpendicular to the second surface of the glass substrate; and
a second wiring including:
a second pillar portion extending in the first direction perpendicular to the first surface of the glass substrate, and
a second beam portion connected to a first surface of the second pillar portion, and extending in the second direction perpendicular to the second surface of the glass substrate,
wherein the first wiring is buried in the glass substrate, and
a first surface of the first beam portion is exposed from the third surface of the glass substrate,
the third surface of the glass substrate includes a first recess portion, and one surface of the first recess portion is formed of one end surface of the first beam portion,
the second wiring is buried in the glass substrate,
a first surface of the second beam portion is exposed from the third surface of the glass substrate,
the third surface of the glass substrate has a second recess portion, one surface of the second recess portion is formed of one end surface of the second beam portion, a part of the third surface of the glass substrate, the first recess portion, and the second recess portion are covered with an electrode layer, and a groove portion that is not provided with the electrode layer is formed between the first wiring and the second wiring on the third surface of the glass substrate.

13. The wiring-buried glass substrate of claim 12, wherein a length of the groove portion in the first direction is longer than a length of the first recess portion in the first direction.

14. The wiring-buried glass substrate of claim 12, wherein the groove portion extends through between the third surface and the first surface of the glass substrate.

* * * * *